US005694005A

United States Patent [19]

Goebel

[11] Patent Number: 5,694,005

[45] Date of Patent: Dec. 2, 1997

[54] PLASMA-AND-MAGNETIC FIELD-ASSISTED, HIGH-POWER MICROWAVE SOURCE AND METHOD

[75] Inventor: Dan M. Goebel, Tarzana, Calif.

[73] Assignee: Hughes Aircraft Company, Los Angeles, Calif.

[21] Appl. No.: 528,036

[22] Filed: Sep. 14, 1995

[51] Int. Cl.[6] .............................. H03F 3/54; H01P 23/24

[52] U.S. Cl. .............................. 315/39; 315/39.3; 330/41

[58] Field of Search ...................... 315/39, 39.3, 111.81; 330/41; 331/94.1, 126

[56] References Cited

U.S. PATENT DOCUMENTS

| | | | |
|---|---|---|---|
| 3,171,053 | 2/1965 | Targ et al. | 315/39 X |
| 3,317,784 | 5/1967 | Ferrari | 330/41 X |
| 3,356,965 | 12/1967 | Agdur | 331/126 X |
| 3,916,239 | 10/1975 | Friedlander | 315/39.3 X |
| 4,912,367 | 3/1990 | Schmacher et al. | 315/3.5 |
| 4,978,889 | 12/1990 | Schumacher | 315/5 X |
| 5,537,005 | 7/1996 | Goebel et al. | 315/111.81 |

FOREIGN PATENT DOCUMENTS

| | | | |
|---|---|---|---|
| 54621 | 6/1982 | European Pat. Off. | 315/111.81 |

*Primary Examiner*—Benny T. Lee

*Attorney, Agent, or Firm*—V. D. Duraiswamy; W. K. Denson-Low

[57] ABSTRACT

The invention is directed to the reduction of an electron beam transport problem during microwave generation in plasma-assisted microwave sources. A small, e.g., <200 gauss, secondary magnetic field is positioned in association with a slow-wave structure (SWS) of the sources to reduce the radial divergence of electron bunches in the sources' electron beams. The secondary magnetic field exerts radial forces on diverging electrons to supplement radial forces of a primary magnetic field and radial forces of an electrostatic field. The primary magnetic field is generated by electron movement in the electron beam and the electrostatic field is generated by ions which are created as the electron beam transits an ionizable gas in the plasma-assisted source. The addition of the secondary magnetic field can be implemented with a coil that is positioned to direct at least a portion of its magnetic field through a passage of the SWS.

21 Claims, 7 Drawing Sheets

PLASMA-AND-MAGNETIC FIELD-ASSISTED, HIGH-POWER MICROWAVE SOURCE AND METHOD

BACKGROUND OF THE INVENTION

1. Field of the Invention

The present invention relates generally to high-power microwave sources.

2. Description of the Related Art

High-power microwave sources can generally be distinguished by the path of their electron beams. In O-type sources, the electron beam travels a linear path, while in M-type sources the electron beam travels over a substantially circular path. Because of their linear path, O-type sources are also known as linear-beam sources. Because the M-type sources typically include a magnetic field which is orthogonally arranged with an electric field, they are often referred to as crossed-field sources.

Linear-beam sources also include a magnetic field but the field is coaxially arranged with the electron beam. This arrangement holds the beam together as it is directed into a microwave interaction region, where a portion of the beam's kinetic energy is converted into electromagnetic energy. Linear-beam sources are broadly differentiated into two groups in accordance with the characteristics of their microwave interaction region. In sources of the first group, e.g., klystrons and coupled-cavity devices, the interaction region is a resonant microwave circuit and electromagnetic energy does not propagate through this circuit. In sources of the second group, e.g., traveling-wave tubes (TWTs), the interaction region is a nonresonant circuit in the form of a slow-wave structure (SWS) and electromagnetic energy propagates along the SWS with substantially the same velocity as the beam electrons. The most common SWS in TWTs is a helix.

In operation, a microwave signal is coupled to the SWS (either as an externally-derived input signal or as an internally-generated random oscillation) and the electron beam is launched through the SWS. The microwave signal energy travels along the SWS as the velocity of light but the axial periodicity of the SWS causes the microwave energy's phase velocity to be slightly slower than the electron beam's velocity. This near-synchronism results in continuous interaction between the electron beam and the microwave energy. Some of the beam electrons are slowed by the microwave energy while others are speeded up. The electrons are therefore velocity modulated into bunches which overtake and interact with the slower electromagnetic energy. In this process, some of the electrons' kinetic energy is transferred to the electromagnetic energy and, as a result, the microwave signal is amplified.

If not otherwise confined, the electron beam tends to radially diverge because of the mutually-repulsive, electrostatic forces between its electrons. These radially-directed forces are a result of the negative space charge of the electron beam. To realize energy exchange in the SWS between the electron beam and the microwave signal, the beam must be radially confined. In TWTs, this confinement is achieved with an axial magnetic field that is typically developed with a solenoid or with permanent magnets. Solenoids are generally wrapped about a housing which contains the SWS and a separate power supply is required to generate the solenoid's current. Solenoids are often used in applications in which size and weight are not critical. Permanent magnets are typically arranged in a string of annular magnets which extend along the SWS. These magnet arrangements develop a substantially sinusoidal magnetic field along the electron beam and are typically called periodic, permanent magnet structures (PPM).

In contrast with TWTs, plasma-assisted, high-power microwave sources confine an electron beam with the aid of a plasma channel. Plasma-assisted, high-power microwave sources were disclosed in U.S. Pat. No. 4,912,367, which issued Mar. 27, 1990 in the name of Robert W. Schumacher et al. and was assigned to Hughes Aircraft Company, the assignee of the present invention.

In these plasma-assisted microwave sources, the plasma channel is generated by passage of the electron beam through an ionizable gas. The ions of the plasma channel generate radially-directed electrostatic forces which oppose the radially-directed forces that are generated by the electron beam's negative space charge. Thus, the electron beam is radially confined and the need for a large solenoid and its attendant power supplies or a large permanent magnet structure is eliminated.

Some of the ions which are generated in the formation of the plasma channel flow back to the negatively-charged cathode of the electron gun. These back-streaming ions can damage a conventional electron gun. Accordingly, the electron gun of a plasma-assisted microwave source preferably has a plasma cathode which can receive the back-streaming ions without damage. In the typical operation of plasma-assisted microwave sources, the ionizable gas is maintained at a low pressure, e.g., $<5\times10^{-4}$ Torr. The complexity of the plasma-assisted microwave source is reduced if the plasma-cathode electron gun can also operate with the same low gas pressure.

The plasma-assisted microwave source disclosed in U.S. Pat. No. 4,912,367 employs a rippled-wall waveguide as a SWS. Because the rippled-wall waveguide is operated near its cutoff frequency, its dimensions increase for operation at lower microwave frequencies, e.g., ~1 GHz. In the lower microwave regions, this SWS can be advantageously replaced with a helix SWS. The helix SWS operates with a TEM mode electromagnetic signal which has a zero cutoff frequency. Thus, the diameter of the helix SWS does not have to expand as the helix SWS is configured for operation in the lower microwave region.

Although these plasma-assisted microwave sources generate large microwave powers, e.g., 1 MW, over long pulse widths, e.g., 100 microseconds, and large bandwidths, e.g., 10%, their efficiency at high output powers, e.g., <20%, has been less than anticipated. Excessive heating of their SWSs is a further indication that these sources are operating at less than optimum efficiencies.

SUMMARY OF THE INVENTION

The present invention is directed to methods and apparatus for improving the efficiency of plasma-assisted, high-power microwave sources.

This goal is facilitated with a discovery that reduced efficiency in these sources is primarily a beam transport problem which is associated with the generation of microwave energy in their SWSs. In particular, it has been discovered that the conventional magnetic and electrostatic beam confining forces of these sources is insufficient to control radial electron divergence in the electron bunches that result from interaction in the SWSs between the electron beam and microwave energy. Consequently, at least a portion of the electrons in the electron bunches are intercepted by the SWSs.

The efficiency improvement goal is then realized with a recognition that the radial divergence of the electron bunches can be controlled with the application of a weak, secondary magnetic field which is positioned to direct at least a portion of the field through a passage of the SWS. This secondary magnetic field exerts radial forces on diverging electrons to supplement the conventional, radially-confining forces of plasma-assisted microwave sources. These conventional forces are generated by a primary magnetic field which results from electron movement in the electron beam and by an electrostatic field which results from ions that are created as the electron beam transits an ionizable gas.

In an embodiment, the secondary magnetic field is generated with a current-carrying coil which is positioned to direct at least a portion of its magnetic field through the SWS passage. It has been discovered that the secondary magnetic field strength can be limited to <300 gauss so that the added weight and size of the coil is relatively slight. In another embodiment, the secondary magnetic field is generated with a periodic, permanent magnet structure.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
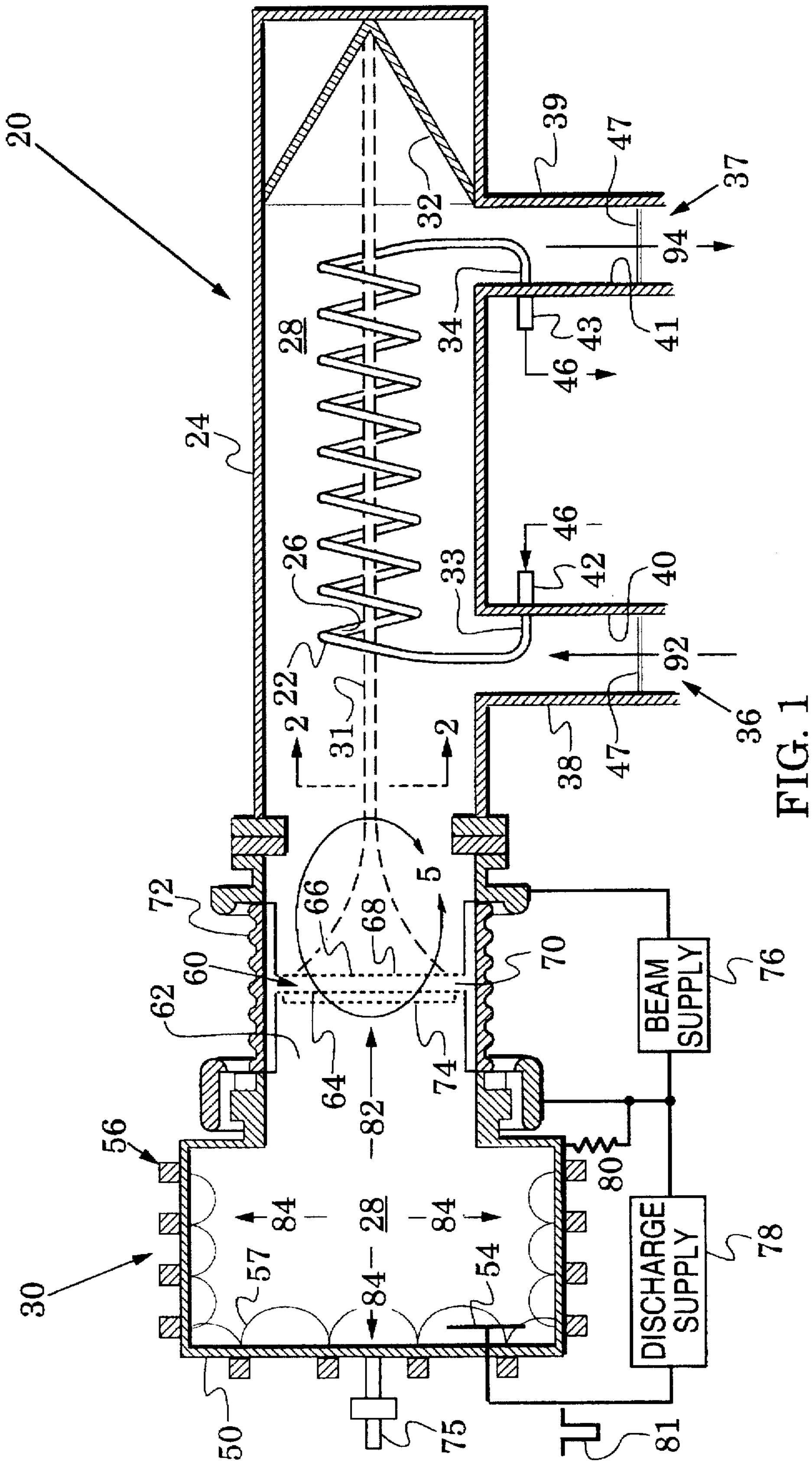
FIG. 1 (PRIOR ART)
FIG. 1 is a sectional, side view of a prior-art, plasma-assisted, high-power microwave generator with a helical SWS.

A plasma-assisted microwave source 20 is illustrated in FIG. 1. The source 20 is similar to the plasma-assisted microwave sources which were disclosed in U.S. Pat. No. 4,912,367. In contrast, however, the plasma-assisted microwave source 20 includes a SWS in the form of a hollow helix 22 which is carried within a housing in the form of a cylindrical waveguide 24. The internal surfaces of the helix 22 define a passage 26 through the helix and the waveguide 24 is filled with a low pressure ionizable gas 28. Coupled to the waveguide 24 is a plasma-cathode electron gun 30 which is positioned to direct an electron beam 31 through the passage 26. After the electron beam 31 has passed through the helix, it is received by a beam collector 32.

Opposing ends 33 and 34 of the helix 22 are coupled respectively with a power-input port 36 and a power output port 37. These ports are formed by waveguides 38 and 39 that communicate with the waveguide 24. The opposing helix ends 33 and 34 are electrically terminated at waveguide walls 40 and 41, respectively but are carried through these walls to form liquid flow ports 42 and 43, respectively. These ports communicate with the interior of the hollow helix 22 to facilitate the flow through the helix interior of a cooling liquid which is indicated by arrows 46. Pressure windows 47 are formed of a suitable material, e.g., quartz, and positioned across each of the ports 36 and 37 to maintain the pressure of the ionizable gas 28.

The electron gun 30 includes an enclosure 50 which is configured to confine a low pressure ionizable gas 28. Positioned in the enclosure 50 is a thermionic electron emitter 54, e.g., a barium oxide, tungsten or lanthanum hexaboride filament or wafer. A system of magnets 56 is arranged about the enclosure 50 to develop a magnetic field whose flux lines 57 are oriented to inhibit the flow of electrons from the plasma to the enclosure 50.

A beam accelerator 60 is positioned adjacent to an outlet 62 of the enclosure 50. The accelerator includes a discharge anode 64 and a beam anode 66 which is spaced from the anode 64. These anodes each define a plurality of apertures 68 and the spacing between the anodes defines an acceleration gap 70. The anodes 64 and 66 are supported on a bushing 72 which is formed from a high-voltage insulating material, e.g., ceramic. A partially transparent electrode in the form of a mesh 74 is coupled to the side of the discharge anode 64 which faces the interior of the enclosure 50. The ionizable gas 28 is injected into the enclosure 50 through a gas feed valve 75.

A high-voltage beam supply 76 is connected across the discharge anode 64 and beam anode 66 to accelerate electrons across the acceleration gap 70. A discharge supply 78 is coupled between the discharge anode 64 and the thermionic emitter 54. A voltage differential resistor 80 is connected between the enclosure 50 and discharge anode 64. The thermionic emitter 54 is heated with a filament supply which is not shown.

In operation of the electron gun 30, the emitter 54 is heated and its thermally-emitted electrons form an electron source which facilitates a plasma discharge from the gas 28 at low gas pressures. The emitter 54 is then driven negatively relative to the discharge anode 64 with pulses 81 from the discharge supply 78. Each discharge pulse ionizes the gas 28 to form a plasma which supplies an electron current 82 to the discharge anode 64 and an electron current 84 to the walls of the enclosure 50. A portion of the electrons in the current 82 are intercepted by the discharge anode 64 and the remainder are accelerated across the acceleration region 70 by the beam supply voltage 76 to pass through the apertures of the beam anode 66 and form the electron beam 31.

Thermionic electron emission from the emitter 54 produces an electron supply which facilitates plasma formation at low pressures of the gas 28. The efficiency of the ionization process is enhanced by directing the portion 84 of the plasma electrons to flow through the magnetic field flux lines 57. This forces the electrons to repeatably pass through the gas 28 before reaching the walls of the enclosure 50. With an extended path, the electrons of the currents 84 have an increased probability of striking gas atoms and producing ions. The current 84 to the walls of the enclosure 50 can be adjusted by selecting the resistance of the voltage differential resistor 80. Current through this resistor causes the potential of the enclosure 50 to be somewhat less than that of the discharge anode 64.

For example, if the resistor 80 is substantially in the range of 1 to 2 ohms, the ratio of the enclosure current 84 to the discharge current 82 will be on the order of 20% which typically produces sufficient plasma to support a high beam current 31. The electron gun 30 can produce the electron beam 31 when the gas 28 is held at a low pressure, e.g., $<5\times10^{-4}$ Torr. Thus, there is no need for additional structure to maintain a differential pressure between the gas of the electron gun 30 and the gas of the helix 22.

The mesh 74 is formed from a low-resistance material, e.g., molybdenum, and defines a face of the plasma source of electrons. This face definition stabilizes the electron beam extraction process that occurs across the acceleration gap 70 by providing a measure of isolation from the plasma discharge process in the enclosure 50. This isolation enhances stable operation and allows the electron gun 30 to operate with reasonably arbitrary voltage and current combinations (e.g., voltages in the range of 20–120 kV and currents in the range of 1–120 amperes). Back streaming plasma ions from the region of the helix 22 are harmlessly absorbed into the plasma face that is defined by the mesh 74. Preferably, the emitter 54 is placed off the center of the enclosure outlet 62 to protect it from the backstreaming ions.

As a result of the operation of the electron gun 30, the electron beam 31 is extracted from the plasma within the enclosure 50 and launched through the passage 26 of the helix 22. A microwave input signal 92 is applied at the input port 36 and is coupled to the helix 22. The axial periodicity of the helix 22 causes the signal's axial phase velocity to be close to the velocity of the electron beam 31 so that there is a continual interaction between them. This interaction transfers energy from the beam electrons to the microwave signal. The microwave energy grows along the helix 22 and is extracted from the plasma-assisted source 20 as an amplified microwave output signal 94 at the output port 37. The remaining energy of the electrons in the beam 31 is absorbed when they are received by the collector 32.

The microwave source 20 can be adapted to operate as an oscillator by terminating the port 37 with a microwave load. In this arrangement of the source, random thermal noise of electrons in the electron beam 31 form electromagnetic energy on the SWS which interacts with the electron beam 31 to gain energy. The flow of this amplified signal is generally opposite to the electron beam 31 and it is coupled out of the microwave source at the port 36.

Figure 2:
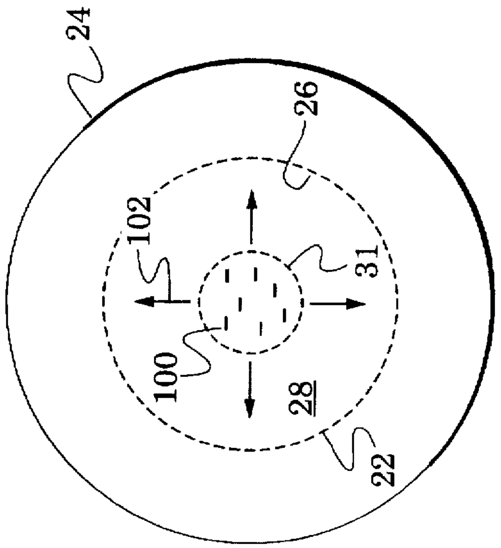
FIG. 2 (PRIOR ART)
FIG. 2 is an enlarged view along the plane 2—2 of FIG. 1 which illustrates radially-directed dispersive forces caused by electrostatic repulsion of electrons in an electron beam of FIG. 1.

FIG. 2 illustrates the electrostatic, radially-directed forces of the electron beam's negative space charge. In FIG. 2, the cross sections of the helix 22 and the electron beam 31 are indicated as broken-line circles and the helix 22, the beam 31 and the waveguide 24 are coaxially arranged with the ionizable gas 28 contained within the waveguide 24. Because the beam electrons 100 each carry a negative electric charge, they repel each other. This cumulative repulsion results from the negative space charge of the electron beam and it can be represented as radially-directed forces 102 which act on each beam electron to disperse the beam 31. If not opposed by other forces, the negative space charge would cause the beam 31 to "blow up" so that a significant portion of the beam 31 would not traverse the passage 26 and participate in the energy interaction process with the microwave signal which is traveling along the helix 22. This would cause a decrease in the efficiency of the microwave source 20.

Figure 3:
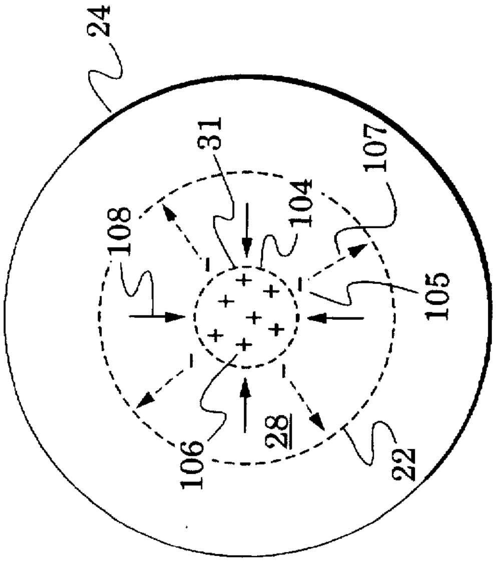
FIG. 3 (PRIOR ART)
FIG. 3 is a view similar to FIG. 2, which illustrates radially-directed, electrostatic, electron beam confining forces which result from plasma channel ions in the source of FIG. 1.

FIG. 3 is similar to FIG. 2 with like elements indicated by like reference numbers. FIG. 3 illustrates a plasma channel 104 (the radial extent of the channel is substantially equal to that of the beam 31) which is generated by the transit of the electron beam 31 through the ionizable gas 28. Some of the beam electrons collide with atoms of the gas 28 and their kinetic energy is sufficient to divide the atoms into negatively charged electrons 105 and positively charged ions 106. The electrons 105 are relatively "cold", i.e., their energy is far less than that of the beam electrons. Accordingly, most of them flow outward to the helix 22 or to the walls of the waveguide 24 along paths which are schematically indicated by the broken-line arrows 107.

The heavier ions 106 remain behind and, because they are positively charged they attract the electrons of the beam 31. This attraction generates radially-directed, electrostatic confining forces 108 on each beam electron. The forces 108 are in opposition with the forces 102 of FIG. 2 and they, therefore, tend to neutralize the forces 102 due to the negative space charge. Beam propagation with the electrostatic confinement aid of a neutralizing plasma channel is generally referred to as "transport in an ion-focused regime" (IFR).

Figure 4:
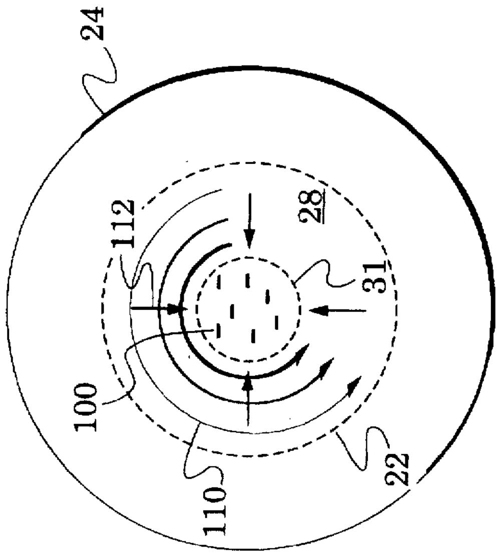
FIG. 4 (PRIOR ART)
FIG. 4 is a view similar to FIG. 2, which illustrates radially-directed, magnetic, electron beam confining forces which result from a circumferentially-directed magnetic field that is generated by an electron beam of FIG. 1.

FIG. 4 is similar to FIG. 2 with like elements indicated by like reference numbers. As a consequence of Ampere's Law, the axial movement of the negatively charged beam electrons 100 along the beam 31 generates a circumferentially-directed magnetic field. This magnetic field is indicated by the flux lines 110 whose strength decreases radially from the beam 31. In accordance with Lorentz's Law, forces 112 are generated on the axially-directed beam electrons which are orthogonal to both the magnetic field lines 110 and the electron path. These radially-directed, magnetic confining forces 112 act on each beam electron 100 and are also in opposition with the forces 102 of FIG. 2 due to the negative space charge.

Figure 5:
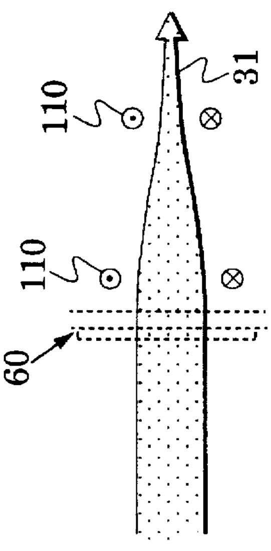
FIG. 5 (PRIOR ART)
FIG. 5 is an enlarged view of the structure within the curved line 5 of FIG. 1 illustrating the pinching of an electron beam due to the confining forces of FIGS. 3 and 4.

The radially-directed, electrostatic confining forces 108 of FIG. 3 and the radially-directed, magnetic confining forces 112 of FIG. 4 combine to radially compress the electron beam 31 as it leaves the accelerator 60 of FIG. 1. This process is commonly called the Bennet pinch effect and is illustrated in FIG. 5 in which the beam 31 narrows as it is launched past the accelerator 60. In this figure, the magnetic flux lines 110 are schematically indicated by pairs of arrowheads and arrowtails. In the microwave source 20, these confining forces typically pinch the electron beam to very small diameters, e.g., 1–2 centimeters, and very large current densities, e.g., >200 A/cm$^2$.

Indications of an Efficiency Problem

Figure 6:
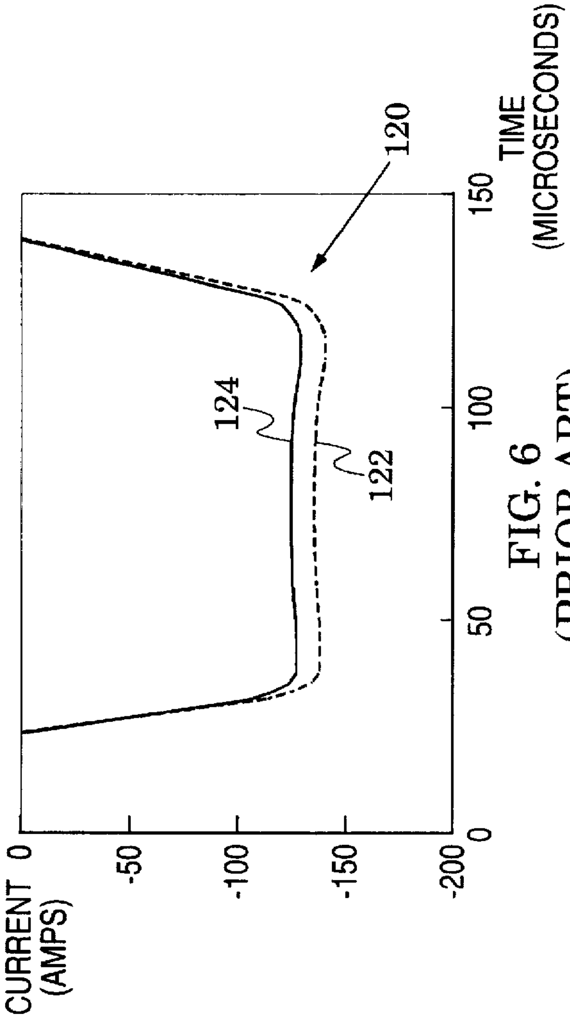
FIG. 6 (PRIOR ART)
FIG. 6 is a diagram which shows electron-gun beam current and collector beam current in an exemplary microwave generator which is similar to the generator of FIG. 1 with its helical SWS removed.

Tests have been conducted of electron beam propagation through the plasma channel of a plasma-assisted source which is similar to the source 20 of FIG. 1 with the source's SWS removed. These tests demonstrated efficient beam transport for considerable distances, e.g., >2 meters. One of these tests obtained the results of the diagram 120 of FIG. 6 which illustrates an electron gun's beam current pulse 122 and the current pulse 124 at a collector that was spaced >1 meter from the electron gun. Over 90% of the beam current pulse was received at the collector.

However, significant decreases of collector current and excessive SWS heating have been observed in complete plasma-assisted sources, i.e., sources which include the SWS. These observations are consistent with measurements of the output microwave power which indicate less-than-optimum efficiencies.

Figure 7A:
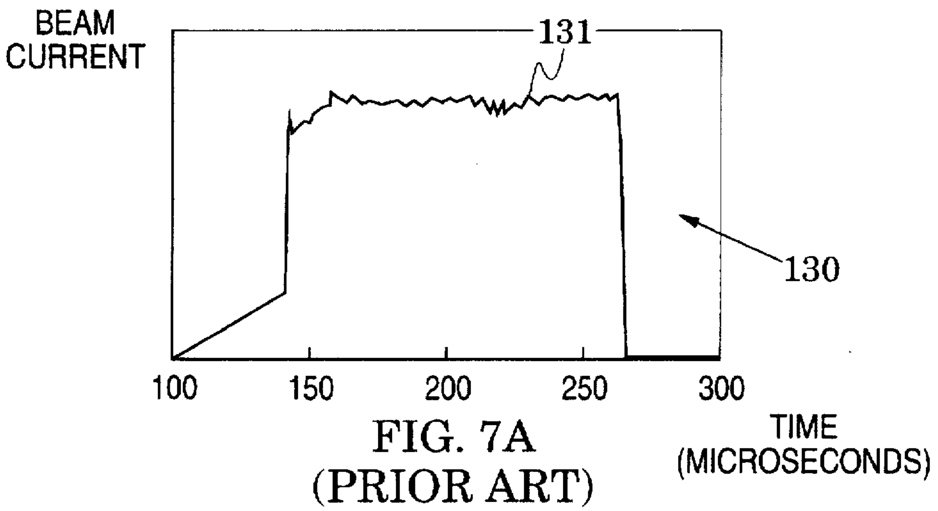
FIG. 7A (PRIOR ART)
FIG. 7A is a diagram of a beam current pulse in the microwave generator of FIG. 1 in which a system impurity buildup occurred.
Figure 7B:
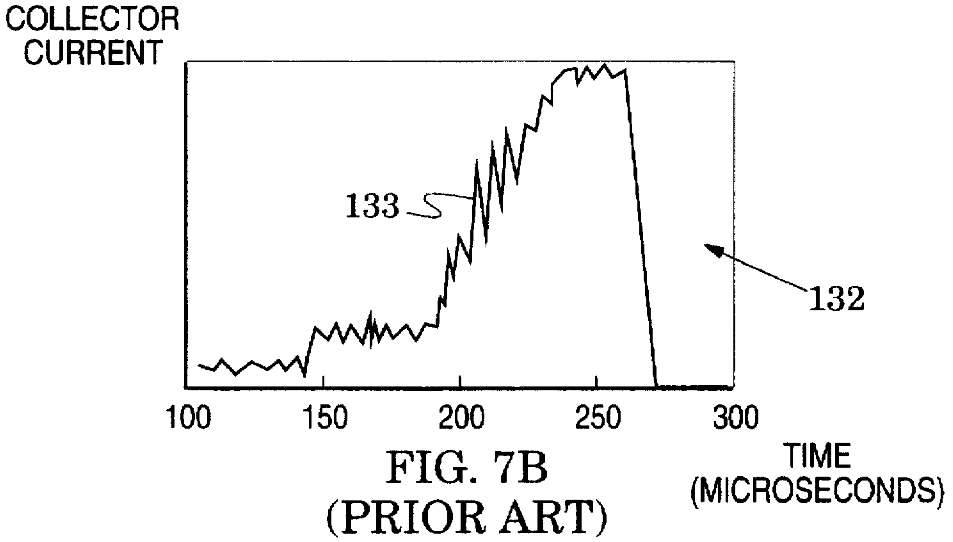
FIG. 7B (PRIOR ART)
FIG. 7B is a diagram of collector current during the pulse of FIG. 8A.
Figure 7C:
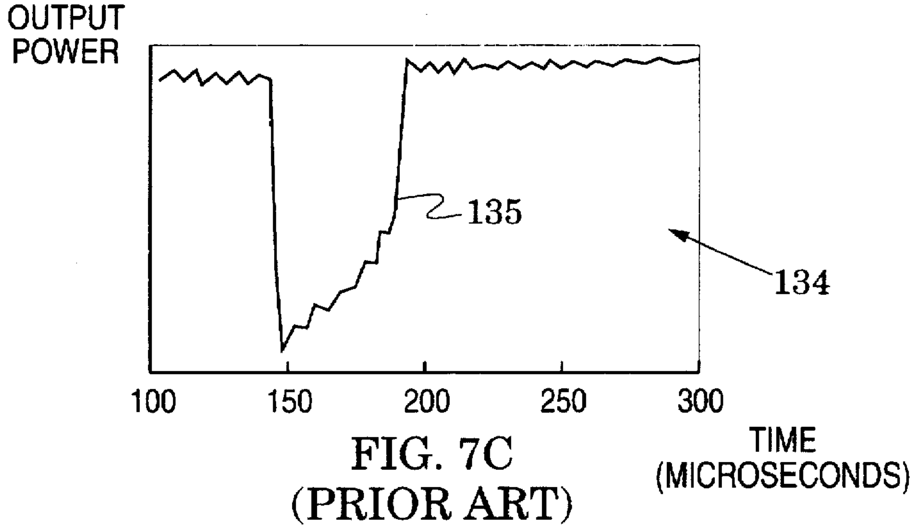
FIG. 7C (PRIOR ART)
FIG. 7C is a diagram of output power during the pulse of FIG. 8A.

In a first observation, a microwave power output pulse of a plasma-assisted source was interrupted because of impurity buildup in the source. During this pulse, significant collector current was measured only when the mircrowave power was interrupted. This observation is shown in the graphs 130, 132 and 134 of FIGS. 7A, 7B and 7C which respectively indicate beam current 131, collector current 133 and output power 135. FIG. 7A illustrates a beam current pulse and, as shown in FIG. 7C, an output power pulse initially grows in coincidence with the beam current pulse and then rapidly decays due to the impurity buildup. FIG. 7B shows that the collector current was very low in the initial portion of the beam current pulse. After the output power decayed in FIG. 7C, the collector current increased to substantially equal the beam current.

Figure 8A:
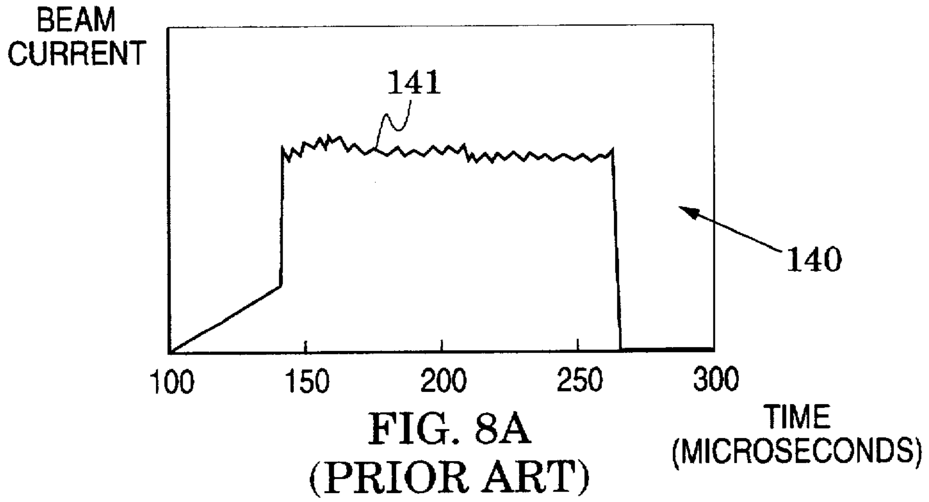
FIG. 8A (PRIOR ART)
FIG. 8A is a diagram of a beam current pulse in the microwave generator of FIG. 1 in which an arc occurred in the generator's helical SWS.
Figure 8B:
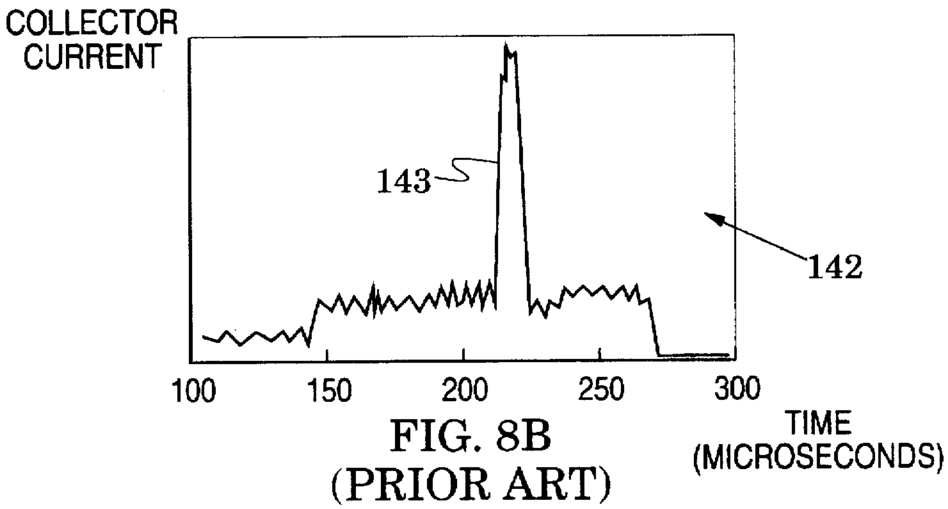
FIG. 8B (PRIOR ART)
FIG. 8B is a diagram of collector current during the pulse of FIG. 8A.
Figure 8C:
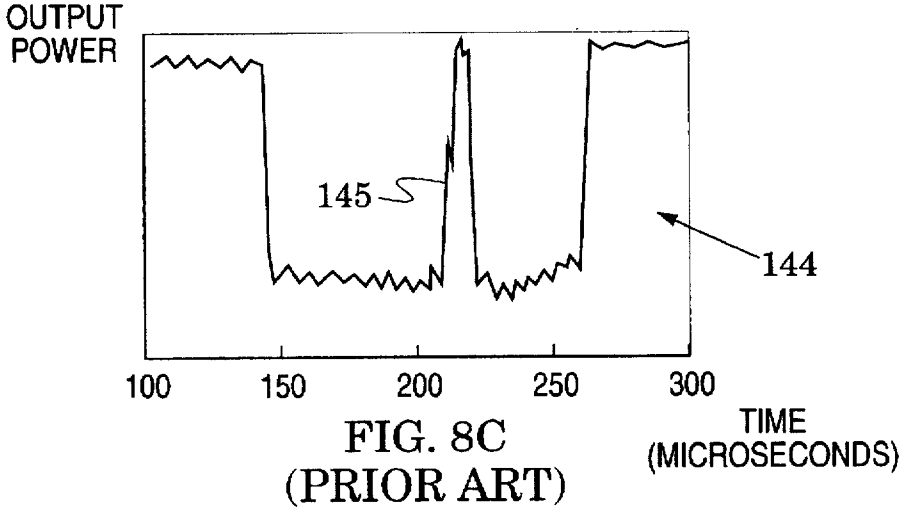
FIG. 8C (PRIOR ART)
FIG. 8C is a diagram of output power during the pulse of FIG. 8A.

In a second observation, a microwave power output pulse of a plasma-assisted source was interrupted because of an arc in its SWS. During the power interruption spike, the collector current significantly increased. This observation is shown in the graphs 140, 142 and 144 of FIGS. 8A, 8B and 8C which respectively indicate beam current 141, collector current 143 and output power 145. FIG. 8A illustrates another beam current pulse and, as shown in FIG. 8C, an output power pulse includes a pulse portion in which the power decays because of the SWS arc. FIG. 8B shows that the collector current rose to substantially equal the beam current only during the low portion of the output power pulse.

FIGS. 7A–7C and 8A–8C indicate only the shapes of beam current, collector current and the output power pulses and, accordingly, the vertical axes of these graphs do not carry specific values. The output power pulses of FIGS. 7C and 8C are inverted relative to the beam current pulses of FIGS. 7A and 8A and the collector current pulses of FIGS. 7B and 8B.

These observations indicated that proper beam transport only occurred when rf power generation in the SWS was suppressed.

Discovery of the Problem's Source

The graphs of FIGS. 7A–7C and 8A–8C also seemed to indicate that the SWS was not directly intercepting the electron beam. To confirm this, beam-limiting irises were installed at the leading end of the helix passage 26 to reduce the passage diameter. The current induced into these irises was then monitored and it was found that the irises were not conducting significant currents, i.e., they were not intercepting a significant portion of the electron beam 31. This test proved that the beam 31 must be diverging after it passed the entrance of the helix passage 26.

The observations and the iris test led to the conclusion that some process associated with the SWS was causing the drop in collector current and the excessive SWS heating. The most significant process associated with the SWS is the electron bunching which occurs during the interaction between the electron beam and the microwave energy.

The stability of electron bunching can be studied by considering the ratio of plasma ions to beam electrons which is generally referred to as the "neutralization fraction". It is a measure of conditions in the plasma-assisted system for successful propagation. When the electron beam 31 encounters the neutral gas 28 in the source 20, it forms the plasma channel (104 in FIG. 3) by ionizing the gas. As shown in FIG. 2, the slower gas electrons are then ejected from the plasma channel by the negative space charge of the fast, axially-directed beam electrons. The resulting mixture is composed primarily of beam electrons and plasma ions.

Preferably, a sufficient number of ions are generated and retained in the plasma channel to cancel the beam's negative space charge and facilitate beam propagation which then creates more ions. Neutralization fractions are very close to one, i.e., substantially equal ion and electron densities, for IFR beam transport.

In general, this transport process is a self-regulating one. An increase in channel diameter because of electron divergence produces more ions, which increases the radially-directed confining forces that are produced by the ions. This, in turn, confines the electrons and causes a decrease in the channel diameter. It is an equilibrium situation in that an insufficient ion density causes the beam 31 to blow up due to space charge effects and too large an ion density results in beam instabilities.

The neutralization factor is also a function of several controllable factors, e.g., beam current, beam voltage, density of the ionizable gas and the mass of the ionizable gas. For example, a 65 kV, 100 ampere beam in a gas of xenon typically requires a gas pressure in the range of $1\times10^{-5}$ to $1\times10^{-4}$ Torr. When helium is used, the gas pressure is preferably in the range of $1\times10^{-5}$ to $1\times10^{-3}$ Torr.

Figure 9:
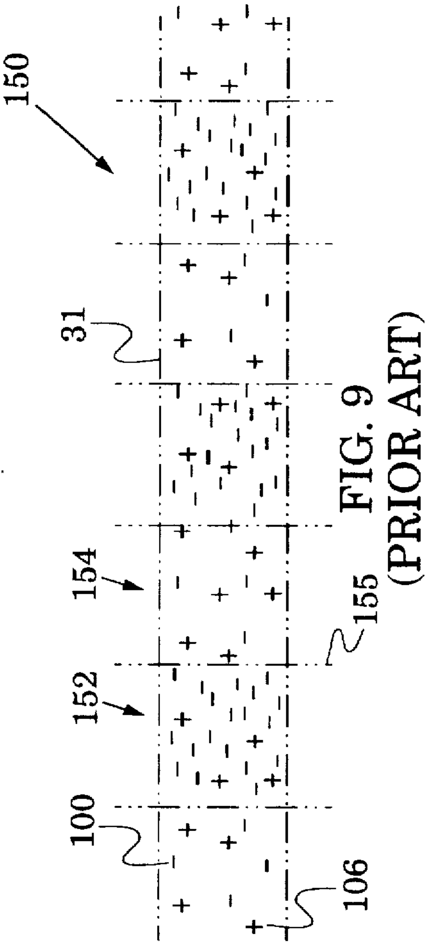
FIG. 9 (PRIOR ART)
FIG. 9 is a diagram which illustrates electron bunching in an electron beam of the generator of FIG. 1.

The bunched electron beam which propagates through the SWS passage 26 has the physical appearance of a plasma wave (a moving Langmuir wave or electron-plasma wave) and is typically referred to as the "Slow Space-Charge Wave" in the microwave-device literature. As schematically illustrated with electrons 100 and ions 106 in the diagram 150 of FIG. 9, this "charge-density" wave has the characteristics of a higher-than-average electron density in the bunches 152 of the electron beam 31 and a lower-than-average electron density in the regions 154 between the bunches. For clarity of illustration, the edges of the bunches 152 are emphasized by broken lines 155.

The presence of the bunched electrons violates the equilibrium conditions set up by the plasma channel to produce beam transport. The ions in the system cannot react on the time scale in which the electron bunches 152 move through the system, i.e., they are effectively stationary. The bunches are then perturbations on the equilibrium beam-plasma system. Inside each bunch, the number of electrons exceeds the number of ions (too low a neutralization factor) and the bunched electrons start to diverge due to negative space-charge forces. It is theorized that the bunches 152 diverge sufficiently to be intercepted by the SWS which causes the observed drops in collector current and heating of the SWS, i.e., there is a problem with beam transport of the electron bunches. When output power drops due to some external cause, e.g., arcing, the interaction process which produces bunches is interrupted. Without bunches, the majority of the electron beam 31 again passes through the SWS passage 26 and is received by the collector 32. Therefore, reduced efficiency of plasma-assisted microwave sources is a result of electron divergence in the electron bunches. The diverging electrons are intercepted by the SWS before they can be received by the collector.

Conceptual Solution of the Problem

The problem's source of divergent electron bunches can be controlled by the application of a secondary or supplemental axial magnetic field. The radial beam-confining forces developed by this magnetic field supplements the primary magnetic beam-confining forces which are developed by the magnetic field of the electron beam and the electrostatic beam-confining forces which are developed by the plasma channel. The required strength of the supplemental magnetic field can be estimated from a simple model that takes into account both the space charge neutralization of the beam electronics by the plasma ions and the magnetic forces from the applied and self-generated fields.

The equation of motion for the electron beam is given by $$m\gamma\left(\frac{d}{dt}v+v\cdot\nabla v\right)=e\left(E+\frac{1}{c}vXB\right), \quad (1)$$

in which $\gamma$ is the relativistic correction of $[1-(v/c)^2]^{-1/2}$ for the electron mass m, v is the electron velocity, $\nabla$ is the mathematical gradient operator, c is the speed of light, E is the electron field, e is the electron charge and B is the magnetic field strength. Assuming steady state conditions the axial velocity component of the beam is uniform ($\gamma$ independently of the beam radius r) and assuming laminar flow such that the convective derivative ($v\cdot\nabla v$) describes the centrifugal force by $v_\theta^2/r$, the radial force is given by in which $v_\theta$ is the angular electron velocity, $E_r$ is the radial electron field, $v_z$ is the axial electron velocity, $B_\theta$ is the angular magnetic field strength, $v_\theta$ is the angular electron velocity and $B_z$ is the axial magnetic field strength $$m\gamma\frac{v_\theta^2}{r}-eE_r-\frac{e}{c}v_zB_\theta+\frac{e}{c}v_\theta B_z=0.$$

The electric and magnetic field values can be calculated from Maxwell's equations. Poisson's equation $$\nabla\cdot E=4\pi e(n_i-n_e-n_b)$$

is integrated from the axis to the beam radius r in cylindrical coordinates to find $$E_r=2\pi ern_b(1-f), \quad (2)$$

in which $n_i$ is the ion density, $n_e$ is the slow electron density which is neglected, $n_b$ is the beam density and the neutralization fraction f is given by $n_i/n_e$. Gauss's Law $$\nabla XB=\frac{4\pi}{c}J$$

is also integrated over the cylindrical beam to find $$B_\theta=\frac{2J}{cr}=\frac{2\pi ren_bv_z}{c}, \quad (3)$$

in which the beam current density d is given by $J=n_bevA=n_bev_z\pi^2r$ in which A is the beam area. Inserting the values from equations (2) and (3) into equation (1) yields $$\gamma\frac{v^2}{r}-\frac{\omega_b^2r}{2}(1-f-\beta^2)+v\frac{eB_z}{mc}=0,$$

in which $\omega_b$ is the angular frequency of beam electrons, $\beta$ is a normalization correction factor $B=v_z/c$ and $\omega_b^2=4\pi e^2n_b/m$. Defining an angular electron frequency $\omega_\sigma=v/r$ and an angular ion frequency $\Omega=eB_z/mc$ produces $$\gamma\omega_\theta^2+\Omega\omega_\theta-\frac{\omega_b^2}{2}(1-f-\beta^2)=0,$$

which has a solution for equilibrium to exist (i.e., laminar flow of electrons) of $$\omega_\theta=\frac{\Omega}{2\gamma}\left\{1\pm\left[1-\frac{2\omega_b^2\gamma}{\Omega^2}(1-f-\beta^2)\right]^{1/2}\right\}.$$

From this equation, the criterion for the amount of applied axial magnetic field required for uniform electron beam propagation (i.e., stable equilibrium with laminar electron trajectories) is given by $$B_z\geq\left[\frac{2\omega_b^2\gamma mc}{e}(1-f-\beta^2)\right]^{1/2}. \quad (4)$$

In an example of the required field strengths, an experiment was conducted in which a 100 ampere, 100 kilovolt electron beam was directed at "witness plates" to create a damage pattern. The damage patterns indicated that the electron beam pinched down to an equilibrium diameter of ~1.8 centimeter in a beam distance from the electron gun of centimeters. In this example, the beam electron density (from $I=n_eevA$) is $3\times10^9$ cm$^{-3}$, and the plasma frequency $\omega_b=4\pi e^2n_e/m=4.4\times10^9$. By solving equation (4) for $B_z=0$ and inserting this data, a neutralization fraction of ~0.97 is obtained.

If a worst case factor of two is assumed for the bunching which occurs with the SWS inserted into the microwave source, the electron density in the bunch is twice the equilibrium value of $3\times10^9$ cm$^{-3}$, and the neutralization fraction is half the equilibrium value, i.e., ~0.5. Inserting these values into equation (4) discloses that the applied magnetic field required to compensate the beam bunching is on the order of only 132 gauss. That is, with an assumed bunching factor of 2 and a beam current of 100 amperes, the required field strength is less than 200 gauss. Even with larger beam currents, e.g., 200 amperes, the calculations indicate that magnetic fields of less than 500 gauss are sufficient to contain electron divergence in the beam bunches.

Solution Embodiments

Figure 10:
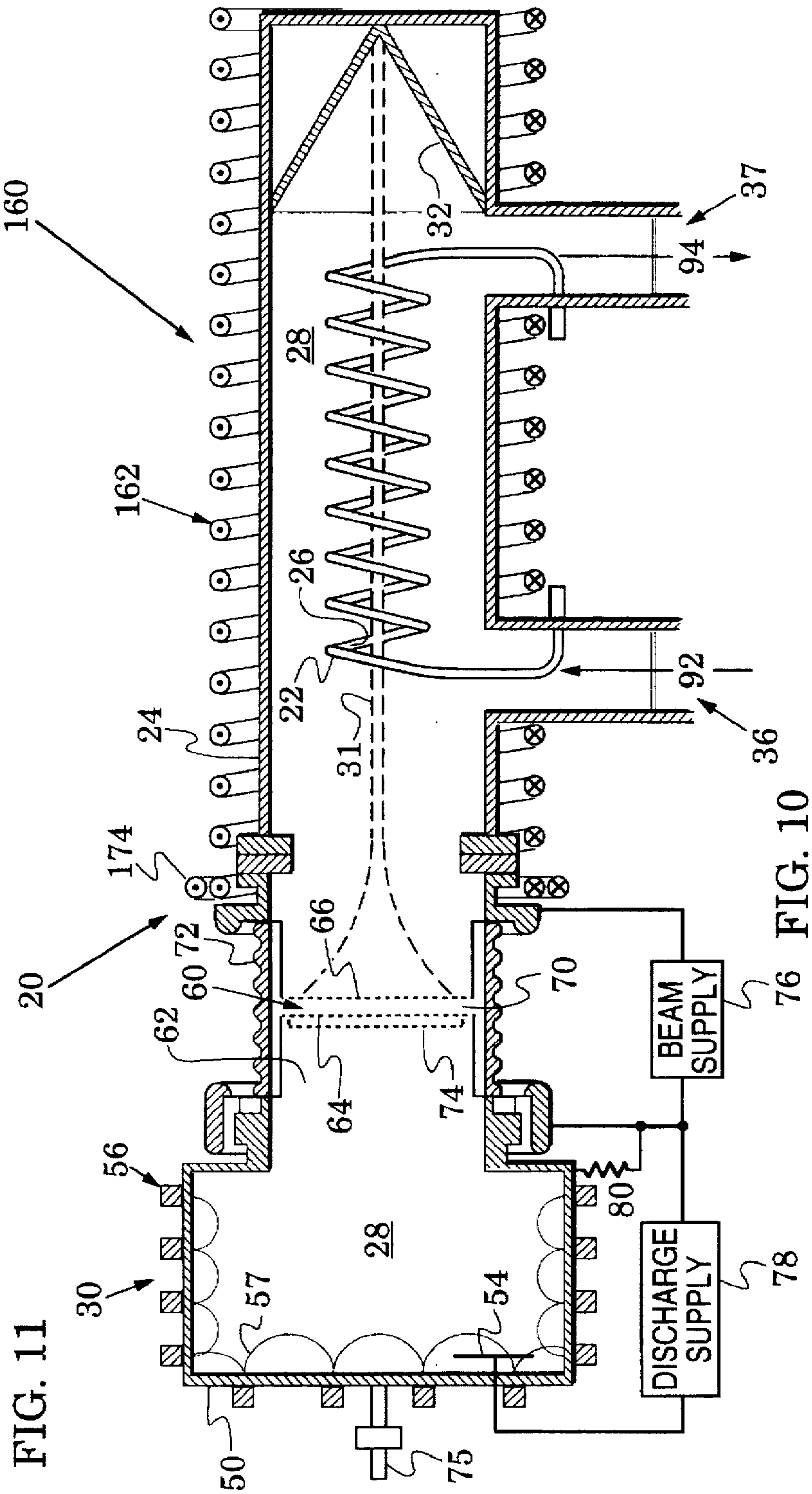
FIG. 10 is a sectional, side view of a plasma and magnetic field-assisted, high-power microwave generator in accordance with the present invention.

FIG. 10 illustrates a plasma and magnetic field-assisted microwave source 160 in accordance with the invention. The source 160 is formed by the addition of a magnetic field generator in the form of a coil 162 to the plasma-assisted microwave source 20 of FIG. 1. Accordingly, like elements of FIGS. 1 and 10 are indicated by like reference numbers. The coil 162 is positioned about the waveguide 24 and is configured to carry current and generate the small, secondary magnetic field which was calculated above to supplement the primary field that is generated by the electron beam 31 (flux lines 110 in FIG. 4). The coil is positioned so that a substantial portion of its generated magnetic field is directed through the helix passage 26 to confine the divergence tendency of the electron bunches (152 in FIG. 9). The current in the coil is conventionally indicated by dots and crosses in opposite sectioned ends. The current can be provided in various ways which are well known in the coil art, e.g., by coupling it to a power supply.

Figure 11:
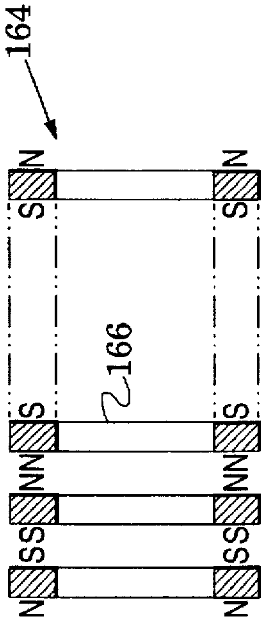
FIG. 11 is a sectional, side view of another magnetic generator embodiment which is suitable for the microwave generator of FIG. 10.

FIG. 11 illustrates another magnetic field generator 164 which is suitable for generating the secondary magnetic field in the microwave source 160 of FIG. 10. The generator 164 has a series of annular, permanent magnets 166 which are arranged coaxially and also arranged so that the magnetic polarity of adjacent magnets are opposed (i.e., NN or SS). This arrangement is conventionally known as a periodic, permanent magnet structure (PPM). When used with the microwave source 20 in FIG. 10, the PPM 164 would be positioned substantially similar to the position of the coil 162. Although the magnetic field developed by the PPM 164 periodically reverses its direction, it is functionally equivalent to the magnetic field of the coil 162 in controlling electron divergence.

Figure 12A:
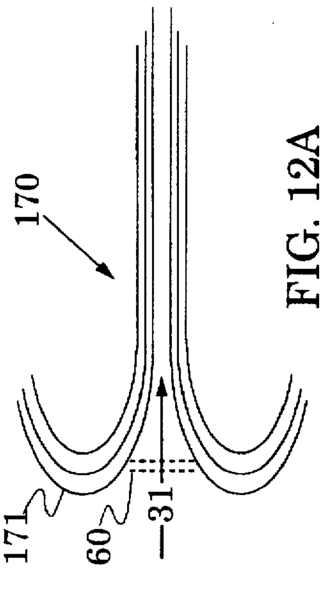
FIG. 12A is a schematic showing a possible spatial relationship between a magnetic field and an acceleration structure in the generator of FIG. 10.
Figure 12B:
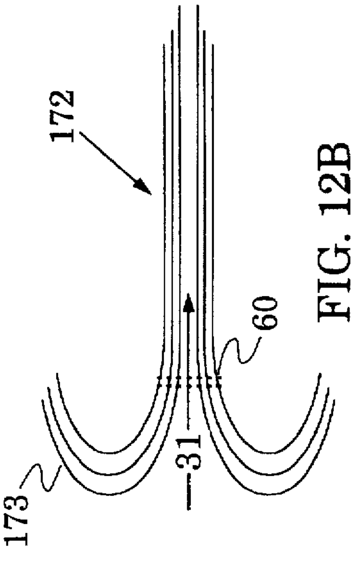
FIG. 12B is a schematic showing a preferred spatial relationship between a magnetic field and an acceleration structure in the generator of FIG. 10.

The coil 162 of FIG. 10 (or the PPM 164 of FIG. 11) is preferably configured to generate a magnetic field 173 which penetrates into the accelerator 60 so that the beam 31 is launched along an axial magnetic field as illustrated in the diagram 172 of FIG. 12B and not into the increasing field strength (a magnetic cusp) of the field 171 which is illustrated in the diagram 170 of FIG. 12A. The relationship in FIG. 12A between the magnetic field 171 and the accelerator 60 can cause an undesirable amount of electron rotation about the electron beam axis. The relationship of FIG. 12B can be accomplished with various coil configurations and positions, e.g., by adding additional coil turns (such as the turn 174 in FIG. 10) adjacent the accelerator end of the coil. As previously stated, the coil 162 is also positioned so that at least a substantial portion of its field (173 in FIG. 12B) is directed through the passage 26 in FIG. 10. Both the coil 162 and the PPM 164 are preferably arranged coaxially with the helix 22 of FIG. 10.

For an exemplary source 160 that would typically weigh ~45 kilograms, the diameter of the coil 162 in FIG. 10 would be on the order of 12 to 13 centimeters. To obtain the exemplary calculated field strength of 132 gauss, the equation of $B=\mu_0 NI$ (in which $\mu_O$ is the permeability of free space, N is the number of turns/meter and I is the coil current in amperes) can be used. This equation gives the field strength (in Tesla) for a long solenoid. Using this equation in a coil design that has 2 turns/centimeter, it is found that a current of ~50 amperes (and ~302 watts of power) can produce the required field and that the coil would weigh ~4 kilograms. The addition of the coil 162 adds less than a 10% gain in weight.

Figure 13:
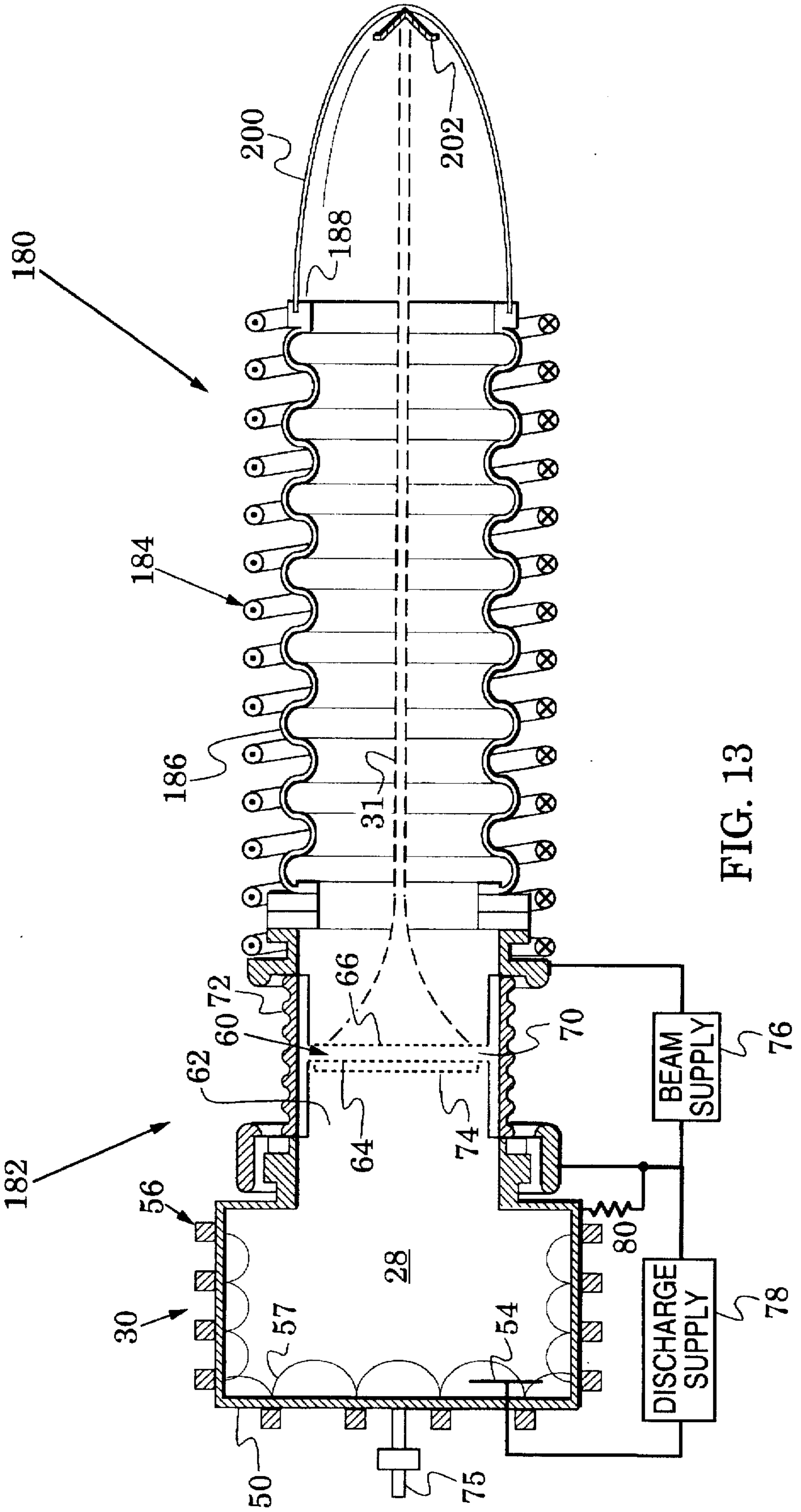
FIG. 13 is a sectional, side view of another plasma and magnetic field-assisted, high-power microwave generator which has a rippled-wall SWS.

FIG. 13 illustrates another plasma and magnetic field-assisted microwave source 180 in accordance with the invention. FIG. 13 is similar to FIG. 10 with like elements indicated by like reference numbers. However, the microwave source 180 substitutes a plasma-assisted source 182 for the plasma-assisted source 20. A coil 184 is positioned in a similar relationship with the source 182 as was the coil 162 and the source 20 in FIG. 10. The source 182 is the plasma-assisted source which was disclosed in U.S. Pat. No. 4,912,367. The source 182 employs a rippled-wall waveguide 186 as a SWS. The output power of the source 182 is delivered through the output end 188 of its waveguide 186. A microwave-transparent radome 200 is carried at the end 188 to contain the gas 28 and its pressure. A collector 202 is positioned to receive the electron beam 31.

Microwave sources taught by the invention are especially suitable for reducing the radial divergence of electron bunches (152 in FIG. 9) which result from energy interaction between an electron beam and electromagnetic radiation in the SWS of a plasma-assisted microwave source. For this reduction, they require only the generation of a secondary magnetic field to supplement the electrostatic, beam-confining field and the primary magnetic, beam-confining field of the plasma-assisted microwave source. The strength of the secondary magnetic field is relatively small compared to the beam-confining magnetic Held strengths which are required in typical TWTs, e.g., >1 kilogauss.

Efficiency is increased in these microwave sources because improved containment of the electron beam bunches permits the interaction between the electron beam and electromagnetic energy to occur throughout the SWS. Efficiency is further increased because of the increased number of electrons which reach the sources' collectors. Conventional depressed collectors apply a negative potential (with respect to the source body) to reduce the kinetic energy of received electrons. This reduces the energy that is otherwise lost to heat generation. Thus, the source efficiency is increased when more electrons reach the collector.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A method for radially confining beam bunches in an electron beam which is launched through a plasma channel in a passage of a slow-wave structure in a plasma-assisted microwave source, the method comprising the steps of:

generating a magnetic field with a strength which is less than 200 gauss; and directing at least a portion of said magnetic field through said passage to exert radially-confining forces on said beam bunches.

2. A plasma and magnetic field-assisted microwave source, comprising:

a plasma-assisted microwave source arranged with a passage through a slow-wave structure therein and having an electron gun which directs an electron beam through ionizable gas disposed in said passage, said plasma-assisted microwave source having an output port to access a microwave signal which is generated by interaction between said electron beam and electromagnetic energy in said slow wave structures; and a magnetic field generator configured to generate a magnetic field which has a strength less than 200 gauss, said magnetic field arranged with at least a portion of said magnetic field directed through said passage to exert magnetic confinement forces upon electrons which diverge from said electron beam.

3. The microwave source of claim 2, wherein said electron gun is a plasma-cathode electron gun.

4. The microwave source of claim 2, wherein said magnetic field generator includes a coil positioned coaxially with respect to said passage so as to generate said magnetic field when an electrical current passes through said coil.

5. The microwave source of claim 2, wherein said slow-wave structure comprises a rippled-wall waveguide.

6. The microwave source of claim 2, wherein said magnetic field generator comprises a plurality of annular, permanent magnets arranged in a substantially coaxial relationship with respect to said passage.

7. The microwave source of claim 2, wherein said slow-wave structure comprises a helix.

8. A plasma and magnetic field-assisted microwave source, comprising:

a containment vessel configured to contain an ionizable gas;

a slow-wave structure which includes a passage through said slow-wave structure and which is positioned in said containment vessel;

an electron gun positioned to launch an electron beam through said passage, said electron beam thereby launched through said ionizable gas to exert electrostatic confinement forces and primary magnetic confinement forces upon electrons which diverge from said electron beam;

a microwave output port coupled to said slow-wave structure for the extraction of microwave energy which is generated by interaction between said electron beam and electromagnetic energy in said slow wave structure; and a magnetic field generator configured to generate a magnetic field which has a strength less than 200 gauss and which is arranged with at least a portion of said magnetic field directed through-said passage to exert secondary magnetic confinement forces upon electrons which diverge from said electron beam.

9. The microwave source of claim 8, wherein said electron gun includes a plasma cathode.

10. The microwave source of claim 8, wherein said gas is helium under a pressure substantially in the range of $1\times10^{-5}$ to $1\times10^{-3}$ torr.

11. The microwave source of claim 8, wherein said gas is xenon under a pressure substantially in the range of $1\times10^{-5}$ to $1\times10^{-4}$ torr.

12. The microwave source of claim 8, wherein said magnetic field generator includes a coil positioned coaxially with respect to said passage so as to generate said magnetic field when an electrical current passes through said coil.

13. The microwave source of claim 8, wherein said magnetic field generator comprises a plurality of annular, permanent magnets arranged in a substantially coaxial relationship with respect to said passage.

14. The microwave source of claim 8, wherein said slow-wave structure comprises a helix.

15. A plasma and magnetic field-assisted microwave source, comprising:

a containment vessel configured to contain an ionizable gas;

a slow-wave structure defined by at least a portion of said containment vessel, said slow-wave structure having a passage therethrough and positioned in said containment vessel;

an electron gun positioned to launch an electron beam through said passage, said electron beam thereby launched through said ionizable gas to exert electrostatic confinement forces and primary magnetic confinement forces upon electrons which diverge from said electron beam;

a microwave output port coupled to said slow-wave structure for the extraction of microwave energy which is created by interaction between said electron beam and electromagnetic energy in said slow wave structure; and a magnetic field generator configured to generate a magnetic field which has a strength less than 200 gauss and which is arranged with at least a portion of said magnetic field directed through said passage to exert secondary magnetic confinement forces upon electrons which diverge from said electron beam.

16. The microwave source of claim 15, wherein said magnetic field generator includes a coil positioned coaxially with respect to said passage so as to generate said magnetic field when an electrical current passes through said coil.

17. The microwave source of claim 15, wherein said magnetic field generator comprises a plurality of annular, permanent magnets arranged in a substantially coaxial relationship with respect to said passage.

18. The microwave source of claim 15, wherein said slow-wave structure comprises a rippled-wall waveguide.

19. The microwave source of claim 15, wherein said electron gun includes a plasma cathode.

20. The microwave source of claim 15, wherein said gas is helium under a pressure substantially in the range of $1\times10^{-5}$ to $1\times10^{-3}$ torr.

21. The microwave source of claim 15, wherein said gas is xenon under a pressure substantially in the range of $1\times10^{-5}$ to $1\times10^{-4}$ torr.

* * * * *